United States Patent [19]

Umemoto et al.

[11] Patent Number: 5,132,752
[45] Date of Patent: Jul. 21, 1992

[54] FIELD EFFECT TRANSISTOR

[75] Inventors: Yasunari Umemoto, Tokorozawa; Nobuo Kotera; Kiichi Ueyanagi, both of Kokubunji; Norikazu Hashimoto, Hachioji; Nobutoshi Matsunaga; Yasuo Wada, both of Tokyo; Shoji Shukuri, Koganei; Noboru Masuda, Kokubunji; Takehisa Hayashi, Kodaira; Hirotoshi Tanaka, Yamanashi, all of Japan

[73] Assignee: Hitachi, Ltd., Tokyo, Japan

[21] Appl. No.: 658,463

[22] Filed: Feb. 22, 1991

Related U.S. Application Data

[63] Continuation of Ser. No. 313,324, Feb. 21, 1989, abandoned, which is a continuation of Ser. No. 935,174, Nov. 26, 1986, abandoned, which is a continuation-in-part of Ser. No. 865,397, May 21, 1986, abandoned.

[30] Foreign Application Priority Data

| May 22, 1985 | [JP] | Japan | 60-108121 |
| Nov. 26, 1985 | [JP] | Japan | 60-263890 |
| Mar. 17, 1986 | [JP] | Japan | 61-56810 |
| Mar. 17, 1986 | [JP] | Japan | 61-56811 |

[51] Int. Cl.$^5$ .................. H01L 29/80; H01L 29/48; H01L 27/02
[52] U.S. Cl. .................................. 357/22; 357/15; 357/41
[58] Field of Search ............... 357/22, 15, 41, 23.2; 307/501, 548, 554, 303.2

[56] References Cited

U.S. PATENT DOCUMENTS

| 4,558,509 | 12/1985 | Tiwari | 357/91 |
| 4,605,945 | 8/1986 | Katayama et al. | 357/23.2 |
| 4,803,526 | 2/1989 | Terada et al. | 357/15 |

FOREIGN PATENT DOCUMENTS

| 57-211783 | 12/1982 | Japan . | |
| 58-148457 | 9/1983 | Japan | 357/23.2 |
| 58-148465 | 9/1983 | Japan | 357/22 P |
| 59-147464 | 8/1984 | Japan . | |
| 60-27173 | 2/1985 | Japan . | |
| 61-18160 | 1/1986 | Japan | 357/221 |

OTHER PUBLICATIONS

Japanese Journal of Technical Disclosure, vol. 6–16, #81–4352 Aug. 1981 by Umemoto.
IEEE Electron Device Letters, vol. 3 #9, Sep. 1982 by Anderson et al.
Electronics Letters, vol. 20, #2, Jan. 1984 by Umemoto et al.

Primary Examiner—Mark Prenty
Attorney, Agent, or Firm—Antonelli, Terry, Stout & Kraus

[57] ABSTRACT

A field effect transistor formed on a semi-insulator or compound semiconductor substrate comprises a first semiconductor layer forming a source region, a drain region and a channel layer, and a second semiconductor layer having a reverse conduction type to that of the first semiconductor layer. The second semiconductor layer is doped so that it will be totally depleted. Therefore, a portion of the second semiconductor layer adjacent to the substrate will remain conductive. The field effect transistor with this structure prevents the short channel effect and the soft error due to α-particles. A threshold voltage control arrangement is also provided using the feature of a control electrode coupled to the second semiconductor layer and a feedback arrangement.

36 Claims, 10 Drawing Sheets

FIELD EFFECT TRANSISTOR

This application is a continuation of application Ser. No. 313,324 filed Feb. 21, 1989, now abandoned, which is a continuation of application Ser. No. 935,174 filed Nov. 26, 1986, now abandoned, which is a continuation-in-part of application Ser. No. 865,397 filed May 21, 1986, now abandoned.

BACKGROUND OF THE INVENTION

The present invention relates to field effect transistors, and more particularly to a compound semiconductor field effect transistor.

Various proposals have been made for improving the performance of field effect transistors.

In GaAs MESFET one type of compound semiconductor field effect transistor known as a structure such as shown in FIG. 1 has been proposed in order to achieve improved performance (Journal of Technical Disclosure Vol. 6-16, No. 81-4352).

The structure comprises a semi-insulating GaAs substrate 1, an active n-type layer 2, and a buried p-type layer 3 provided between the substrate 1 and the layer 2.

The main role of the buried p-type layer 3 is to suppress short channel effect. The short channel effect is the phenomenon that as the gate length L is decreased the threshold voltage is significantly shifted to the negative direction. In other words, the short channel effect is the phenomenon produced in that electrons injected from a source n+-type layer 5 to the semi-insulating GaAs substrate 1 flow into a drain n+-type layer 6. In other words, in addition to the normal current path flowing through the active n-type layer 2 there is another current path flowing through the semi-insulating GaAs substrate 1. Consequently, the buried p-type layer 3 is provided so that a barrier at the side of the substrate is made high. In this constitution, injection of electrons to the substrate 1 is suppressed and the above-mentioned other current path is eliminated so as to suppress the short channel effect.

The buried p-type layer 3 in this structure is of low concentration and totally depleted, so that parasitic capacitance between the active n-type layer 2 and the buried p-type layer 3 or between the n+-type layers 5, 6 and the buried p-type layer 3 is reduced and the device can act at high speed. Numeral 7 designates a gate electrode, numeral 8 a source electrode, and numeral 9 a drain electrode. A similar device is disclosed also in Japanese patent application laid-open No. 211783/1982.

However, the inventor has found that the GaAs MESFET with above-mentioned structure is susceptible to $\alpha$-particle. That is, a memory such as an SRAM (Static Random Access Memory) constituted using this device is subjected to destruction of the stored information every time the $\alpha$-particles strikes the memory. This phenomenon is called soft error.

Soft error in Si devices was found by T. C. May and M. H. Woods in 1979 (T. C. May and M. H. Woods, IEEE Trans, Electron Device, ED-26, p2, 1979).

The generating mechanism of the soft error in the Si device is usually thought to be as follows. The stored information is held as existence of charge stored in a capacitor of a memory cell in the case of a DRAM (Dynamic Random Access Memory) and as the height of potential at a node in a memory cell in the case of an SRAM. When one $\alpha$-particle enters into the Si substrate, pairs of electrons and holes of $10^6$ in number are generated along the $\alpha$-particle track in the Si substrate, and the electrons or the holes are diffused or drift in the substrate and flow into the capacitor or the node. Therefore the charge amount stored in the capacitor or the potential of the node varies significantly and the memorized information held therein is destroyed. Also in the SRAM constituted using the GaAs MESFET having the buried p-type layer as shown in FIG. 1, the soft error seems to be generated by a similar mechanism.

Next, difference in the soft error phenomenon between the Si device and the GaAs MESFET having the structure of FIG. 1 will be described.

In the Si device, if the carriers generated along the track of one $\alpha$-particle are $10^6$ in the total number, the total amount of the charge flowing in the capacitor or the node is 160 fC at most (corresponding to flowing-in of all generated carriers) and not beyond 160 fC.

The inventor has repeated the measurements in the operation state of the GaAs MESFET having the structure of FIG. 1, and has found the difference between the GaAs MESFET and the Si device as follows.

In the GaAs MESFET having the structure of FIG. 1, the charge amount flowing in the capacitor or the node becomes several times larger than in the Si device when one $\alpha$-particle enters the substrate.

This phenomenon means that the GaAs MESFET having the structure of FIG. 1 is more liable to the soft error caused by the $\alpha$-particles than comparison to the conventional Si device.

This phenomenon means also that a carrier multiplication mechanism which multiples the charge flowing in the node exists in the GaAs MESFET having the structure of FIG. 1.

As one of the carrier multiplication mechanisms, the inventor has found the existence of following mechanism. In this mechanism, the total amount of any of the positive charge (due to a hole) and the negative charge (due to an electron) is an equal quantity of 160 fC. Since the buried p-type layer 3 of the conventional structure is totally depleted, when voltage is applied to the drain n+-type layer 6, electric line of force extend from the drain n+-type layer 6 to the source n+ layer 5. Thus, drifting of the generated carriers is promoted by the electric lines of force. Mobility of electron to determine the drift speed of carriers in GaAs is ten times or more larger than that of holes. Consequently, after electrons are completely absorbed to the drain n+-type layer 6, positive holes still remain in the substrate. Thus, the potential barrier at the side of the substrate is lowered, and injection of electrons from the source n+-type layer 5 is promoted. Thus, a thereby subsidiary current path is formed and new current flows to the drain side. This mechanism is similar to the mechanism of the short channel effect. Since the flowing-in charge becomes several times as large as 160 fC, carrier multiplication is observed.

In the above description, since conduction type of the active layer 2, the source region 5 and the drain region 6 in FIG. 1 is made n-type and conduction type of the buried layer 3 is made p-type, holes generated by $\alpha$-particles remain in the substrate and the carrier multiplication occurs. On the contrary, if conduction type of the active layer 2, the source region 5 and the drain region 6 in FIG. 1 is made p-type and conduction type of the buried layer 3 is made n-type, the multiplication effect of carriers does not occur, because the holes generated by $\alpha$-particles remain in the substrate so as to suppress injection of holes from the source side. In this case, however, if one α-particle enters into the device, the total amount of charge flowing in the electrode becomes about 140 fc at maximum value and is still too large to avoid the soft error.

As above described, in the structure of providing the totally depleted buried layer under the active layer in order to prevent the short channel effect, the soft error due to α-particle cannot be completely prevented. Accordingly, a field effect transistor with structure to prevent both short channel effect and the soft error due to α-particle has been desired.

SUMMARY OF THE INVENTION

An object of the invention is to provide a field effect transistor which is immune to α-particles.

Another object of the invention is to provide a field effect transistor which can prevent the short channel effect and the soft error.

In order to attain the above objects, a field effect transistor of the invention comprises a semiconductor layer to constitute a source region, a drain region and an active layer, and another semiconductor layer which is contacted to the semiconductor layer and conductive in the reverse conduction type with respect to the above-mentioned semiconductor layer and not totally depleted, so as to prevent the short channel effect and the soft error.

The above and other objects, features and advantages of this invention will be more clearly understood from the following detailed description taken in conjunction with accompanying drawings.

DETAILED DESCRIPTION OF THE INVENTION

Figure 2:
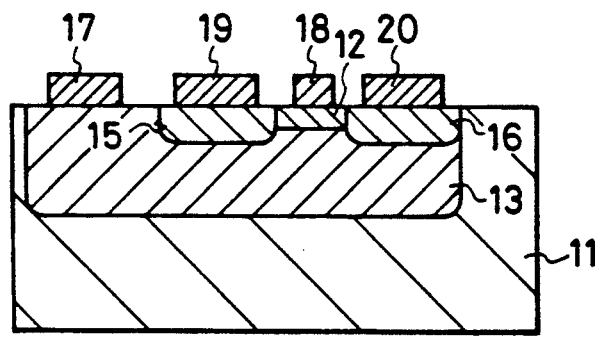
FIG. 2 is a sectional view of a field effect transistor illustrating outline of the invention.

In a device according to the invention, in order to suppress the carrier multiplication and prevent the soft error, for example, a buried p-type layer 13 which is not totally depleted is formed under an active n-type layer 12 or under n+-type layers 15, 16 as shown in FIG. 2. Carrier concentration of the buried p-type layer 13 which is not totally depleted is $10^{15}$ cm$^{-3}$ or more and preferably $10^{16}$ cm$^{-3}$ or more. If the carrier concentration is less than $10^{15}$ cm$^{-3}$, the layer is depleted and the carrier multiplication will occur. Therefore the carrier concentration is preferably $10^{15}$ cm$^{-3}$ at least. Further, if the carrier concentration is $10^{16}$ cm$^{-3}$ or more, it can be easily controlled. It is therefore preferable in practice that the carrier concentration becomes $10^{16}$ cm$^{-3}$ or more. A control electrode 17 is installed to control potential of the buried layer 13. The control electrode 17 is not essential but preferably installed for the stable operation of the FET and higher immunity.

In an FET with this structure, the phenomenon of decrease of the potential barrier due to holes remaining solely in the substrate can be avoided. The reason for this is that the holes flow through a neutral region (i.e. the region which is not depleted) of the buried p-type layer 13 to the control electrode 17, and do not remain in the substrate.

Thus injection of electrons from the source side into the substrate is suppressed so that the carrier multiplication is suppressed.

Also, when conduction type of each layer is reversed to that of the above description, that is when the conduction of the source region 12, the active layer 15 and the drain region 16 is made p-type and conduction type of the buried layer 13 is made n-type, and further when the control electrode 17 is installed, the soft error can be prevented. The reason for this is that electrons generated by the α-particles flow through the buried n-type layer 13 to the control electrode 17, and holes are prevented from flowing into the layers 12, 15, 16 by the static potential of the buried n-type layer 13.

Summarizing this, according to the device structure of the invention, when the active layer is n type and the buried layer is p-type, the carrier multiplication is suppressed and further the total amount of flowing charge can be made less than the charge amount generated by the α-particles. On the contrary, when the active layer is p-type and the buried layer is n-type, the total amount of flowing charge also can be made less than the charge amount generated by the α-particles. Thus the device structure of the invention can increase the immunity to α-particle and prevent the soft error.

Embodiments of the invention will now be described.

First Embodiment

Figure 3:
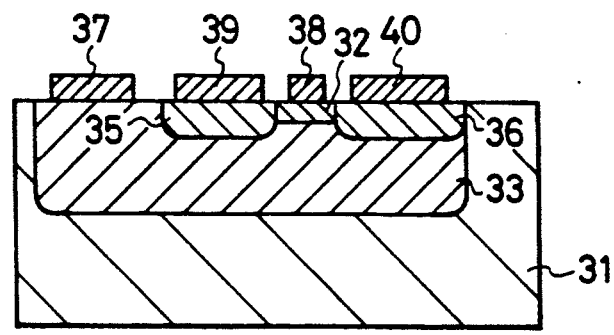
FIG. 3 is a sectional view of a field effect transistor as a first embodiment.

FIG. 3 shows a field effect transistor similar to that of FIG. 2. A buried p-type layer 33, an active n-type layer 32 and n+-type layers 35, 36 are formed on a semi-insulating GaAs substrate 31 by means of ion implantation and subsequent high temperature annealing. The ion implantation of the buried p-type layer 33 may be performed using any of Be, Mg, C, Zn, and the implantation energy depends on the forming conditions of the active n-type layer 32 and the n+-type layers 35, 36 but is usually selected within range of 70 keV~300 keV. The dose depends on the implantation energy so as to satisfy the condition of not being totally depleted, but is usually selected within range of $1 \times 10^{11}$ cm$^{-2}$ or more. The high temperature annealing is usually performed at a temperature of 700° C.~850° C. As a result, carrier concentration of the buried p layer becomes $1 \times 10^{15}$ cm$^{-3}$ or more.

If the dose is $1 \times 10^{12}$ cm$^{-2}$ or more and the high temperature annealing is performed at 700° C.~850° C., the carrier concentration can be made $1 \times 10^{16}$ cm$^{-3}$ or more. The buried p layer is formed to thickness of 1000 Å or more. A source electrode 39, a drain electrode 40 and a gate electrode 38 are formed by ordinary lift-off method. A control electrode 37 of the buried p-type layer 33 may be made of any metal making ohmic contact with the GaAs layer of p-type, such as Cr or AuZn.

According to this embodiment, the carrier multiplication generated by α-particles can be suppressed.

Second Embodiment

Figure 4:
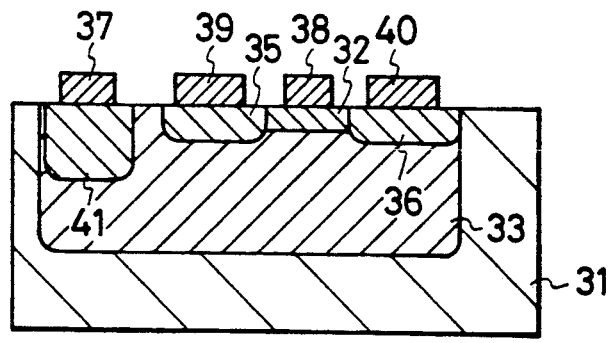
FIG. 4 is a sectional view of a field effect transistor as a second embodiment.

FIG. 4 shows a second embodiment. This embodiment is provided with p+-type layer 41 of higher concentration than that of the buried p-type layer 33 formed under the control electrode 37 in the FET with structure shown in FIG. 3. The p+-type layer 41 is made by the high dose ion implantation of any of Mg, Be, C, Zn and the high temperature annealing process or the selective diffusion process of Zn using an insulation film as a mask. In the case of the ion implantation, the implantation energy is usually selected within range of 10 keV~300 keV and the dose is usually selected within range of $10^{13}$ cm$^{-2}$ or more. In the case of the selective diffusion of Zn, the diffusion is performed at a high temperature of 800° C. or more so that the surface concentration is made $10^{18}$ cm$^{-3}$.

According to this embodiment, the contact resistance between the control electrode 37 and the buried p-type layer 33 can be decreased by one order of magnitude and the carrier multiplication effect can be further reduced in comparison to the FET with structure shown in FIG. 3. In the FET of FIG. 3, in order to provide the ohmic contact with the buried p-type layer 33, the control electrode 37 must be made of metal such as Cr or AuZn being other than metal to be used in the source electrode 39 or the drain electrode 40, i.e., metal giving the ohmic contact with a layer of n-type, such as AuGe. In this embodiment, however, since the p+-type layer 41 is at high concentration, even if the control electrode 37 is made of metal of the same sort as that of the source electrode 39 and the drain electrode 40 or of metal of the same sort as that of the gate electrode 38, the ohmic contact can be realized. Consequently, the addition of a process step for forming the control electrode 37 may be omitted and the whole manufacturing process can be simplified.

Third Embodiment

Figure 5:
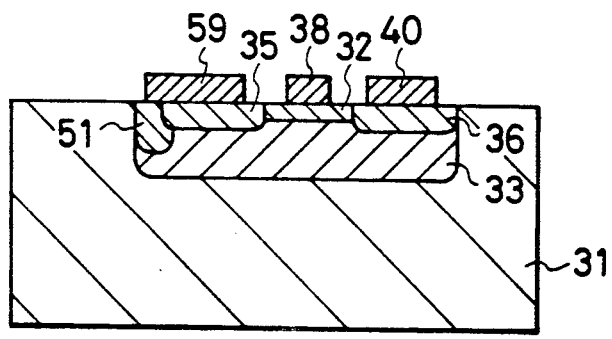
FIG. 5 is a sectional view of a field effect transistor as a third embodiment.

FIG. 5 shows a third embodiment. In this embodiment, p+-type layer 51 of high concentration is formed adjacent to a source n+-type layer 35, and a source electrode 59 is arranged on the n+-type layer 35 and on the p+-type layer 51 simultaneously.

According to this embodiment, the carrier multiplication can be suppressed in a similar manner to the first and second embodiments, and further the area of device can be decreased in comparison to these embodiments so that high integration can be achieved.

In the integrated circuit, the carrier multiplication effect and the soft error by the incident α-particle becomes a problem only at limited elements. If a buried layer is formed, parasitic capacitance will increase. In order that unrequired parasitic capacitance is not produced in the circuit and the circuit speed is maintained, the device structure as shown in FIGS. 3~5 may be preferably adopted only at limited elements where the soft error becomes a problem. From this point of view, as shown in FIGS. 3~5, the device where the buried p-type layer 33 is selectively formed at a required portion is preferable to the structure where the buried layer is formed throughout the integrated circuit.

Fourth Embodiment

Figure 6:
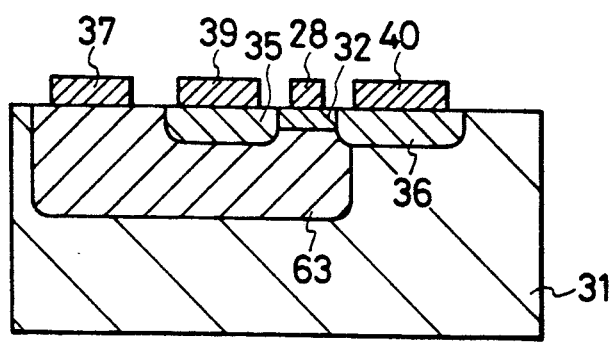
FIG. 6 is a sectional view of a field effect transistor as a fourth embodiment.

FIG. 6 shows a fourth embodiment. In order to maintain the high speed of the integrated circuit as above described, the parasitic capacitance should be eliminated as much as possible. In this embodiment, in order to reduce the parasitic capacitance between a drain n+-type layer 36 and a buried p-type layer 63, the buried p-type layer 63 is not formed under the n+ layer. In order to suppress the carrier multiplication effect and prevent the soft error by the incident α-particle, the lowest condition is in that the buried p layer 63 is formed entirely or partially under any one among the n+-type layer 35, the n+-type layer 36 and the active n-type layer 32. How the buried p-type layer 63 should be arranged depends on design of the speed of the integrated circuit.

Fifth Embodiment

Figure 7:
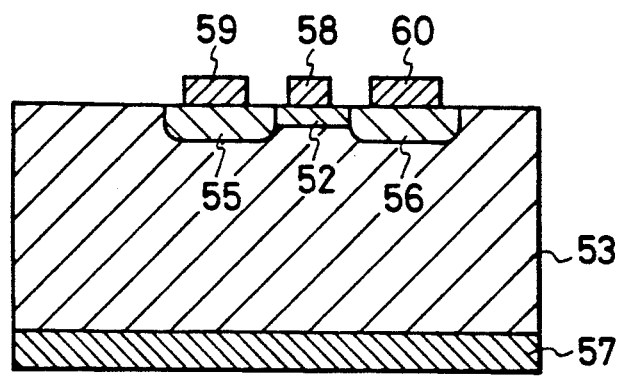
FIG. 7 is a sectional view of a field effect transistor as a fifth embodiment.

FIG. 7 shows a fifth embodiment. An active n-type layer 52 and n+-type layers 55, 56 are formed on p-type GaAs substrate 53 by the ion implantation and the subsequent annealing process. The carrier concentration of the p-type substrate 53 is made range of $10^{15}$ cm$^{-3}$ or more so that the substrate is not totally depleted. A source electrode 59, a drain electrode 60 and a gate electrode 58 are formed by ordinary lift-off method. A control electrode 57 of the p-type substrate 53 may be made of any metal making the ohmic contact with p-type GaAs, such as Cr or AuZn or the like.

According to this embodiment, the carrier multiplication and the soft error generated by α-particle can be suppressed in a similar manner to the third embodiment. Also, the process of forming the buried p layer 33 of FIG. 3 may be omitted and the process can be simplified.

When the buried layer which is not totally depleted is formed under the active layer, the problem of an increase of parasitic capacitance occurs. If the parasitic capacitance increases, the circuit speed will decrease. It is therefore important to decrease the parasitic capacitance. Embodiments from this point of view will be hereinafter described.

Sixth Embodiment

Figure 8:
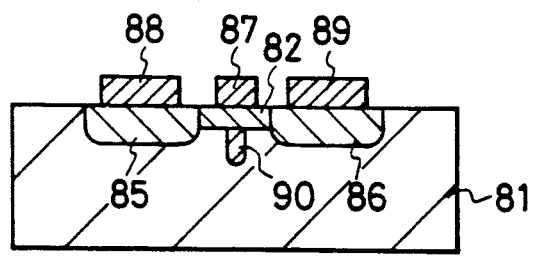
FIG. 8 is a sectional view of a field effect transistor as a sixth embodiment.

FIG. 8 shows a field effect transistor of a sixth embodiment. A buried p-type layer 90, an active n-type layer 82 and n+-type layers 85, 86 are formed on a semi-insulating GaAs substrate 81 by the ion implantation and a subsequent high temperature annealing process. The ion implantation of the buried p-type layer 90 may be performed using any of Be, Mg, C, Zn, and the implantation energy depends on the forming conditions of the n-type channel layer 82 and the n+-type layers 85, 86 but is usually selected within a range of 70 keV ~ 300 keV to aim the formation close to the channel layer 82. The dose depends on the implantation energy but is usually selected within a range of $1 \times 10^{11}$ cm$^{-2}$ or more so that the buried p layer 90 is not totally depleted. A focused ion beam is used in the ion implantation for forming the p-type layer 90. The beam diameter is about 0.2 $\mu$m$\phi$ and the finished width of the p-type layer 90 becomes about 0.25 $\mu$m$\phi$, whereby the capacitance increase due to the buried layer may be neglected. The high temperature annealing is usually performed at a temperature of 700° C. ~ 850° C. A source electrode 88, a drain electrode 89 and a gate electrode 87 are formed by an ordinary lift-off method.

According to such device structure, a decrease of the potential barrier just under the channel layer 82 can be avoided even when positive holes remain in the substrate.

According to the device structure, the phenomenon of decrease of the potential barrier at the substrate side by the positive holes solely remaining in the substrate can be avoided.

Thus injection of electrons from the source side into the substrate is suppressed and the carrier multiplication is prevented. Further, since width of the p-type layer 90 is as narrow as 0.25 $\mu$m or less, increase of capacitance due to the buried layer may be neglected.

Seventh Embodiment

Figure 9:
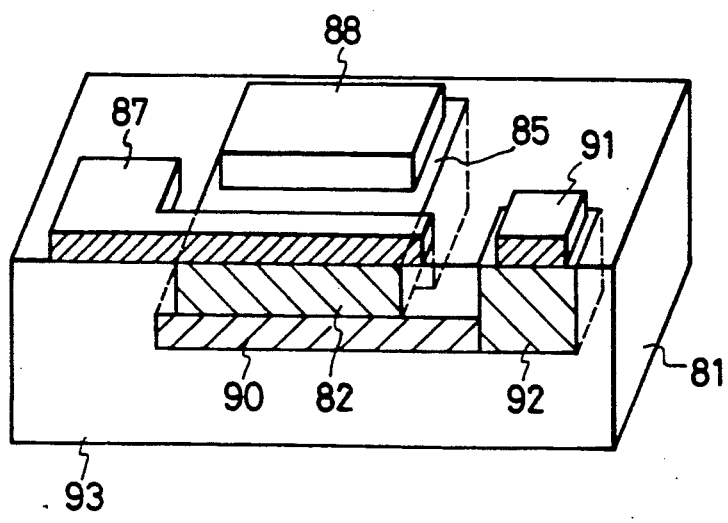
FIG. 9 is a sectional view of a field effect transistor as a seventh embodiment.

FIG. 9 shows structure of a ninth embodiment. In this embodiment, a buried p-type layer 90 is provided with a control electrode 91. FIG. 9 is a view from the side of a sectional surface 93 cutting nearly at the center of a gate electrode 87 and the buried layer 90 along their longitudinal direction. A drain electrode and a drain region exist approximately in symmetry of a source electrode 88 and a source region 85 with respect to the gate electrode 87 in similar manner to the sixth embodiment. Forming conditions of source/drain region, source/drain electrode, the gate electrode 87, the channel 82 and the buried p layer 90 are similar to that of the sixth embodiment.

The p+-type layer 92 electrically connects between the buried layer 90 and the control electrode 91, and may be formed by the high dose ion implantation of any of Mg, Be, C, Zn and the active annealing or by the selective diffusion of Zn. Condition of the active annealing is in a temperature of 700° ~ 850° C. for 15 minutes. The control electrode 91 may be made of Au/Mo, Au/Zn or Au/Cr, and takes the ohmic contact with the p+-type layer 92 by the alloy heat treatment (about 400° C.).

According to this embodiment, effects similar to that of the sixth embodiment are obtained, and since holes generated by $\alpha$-particle under the channel layer 82 can be removed out of the FET through the buried layer 90, the carrier multiplication effect can be further reduced.

Eighth Embodiment

Figure 10:
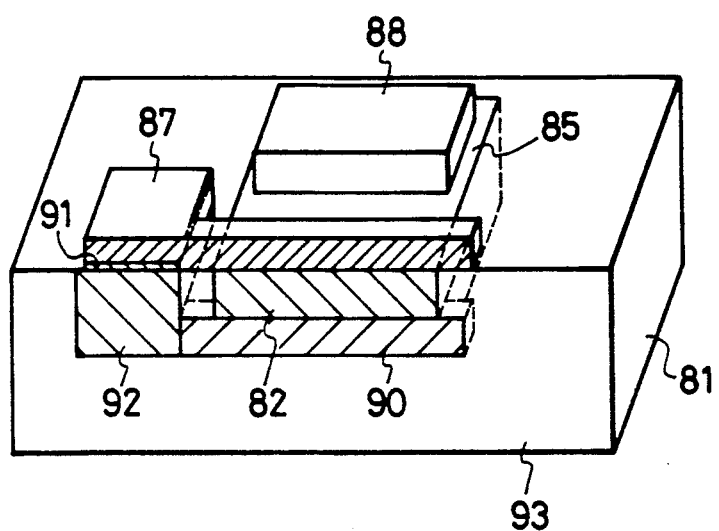
FIG. 10 is a sectional view of a field effect transistor as an eighth embodiment.

FIG. 10 shows an device structure of an eighth embodiment. In this embodiment, the gate electrode 87 and the control electrode 91 of the seventh embodiment are overlaid, thereby both are electrically connected. FIG. 10 is a view from a similar direction to FIG. 9. This embodiment is similar to the seventh embodiment except for the forming position of the control electrode 91 and the p+ layer 92. The p+ layer 92 and the control electrode 91 are formed under the pad of the gate electrode 87. The forming method is similar to that of the seventh embodiment.

According to this embodiment, effects similar to that of the seventh embodiment are obtained, and not only the width of the depletion layer under the gate electrode but also the width of the depletion layer between the buried p layer 90 and the channel layer 82 can be simultaneously varied by the FET control voltage applied to the gate electrode 87, whereby the width of the channel layer can be controlled from upper and lower sides. The width of the buried p-type layer is less than the gate length and, therefore transconductance being two times or more in comparison to greater than that of the prior art can be obtained.

Ninth Embodiment

Figure 1:
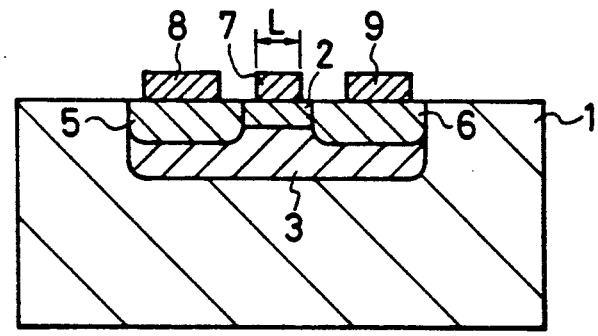
FIG. 1 is a sectional view of a field effect transistor in the prior art.

A ninth embodiment will be described referring to FIG. 11. In order to only suppress the influence by $\alpha$-particles, concentration in the buried p-type layer 3 in the structure of FIG. 1 may be made high so that the buried p-type layer, 3 is not totally depleted. However, in this structure (structure of high concentration of the buried p-type layer 3 in FIG. 1 so that the layer is not totally depleted), the parasitic capacitance of the device increases and the high speed of the device is inhibited. Consequently, in this embodiment, a buried p-type layer 117 just under the active layer is made with low concentration, and further p-type layer 118 of high concentration is arranged at a deep portion. If the p-type layer 118 of high concentration is conductive, effects of this embodiment are obtained even when the p-type layer 117 of low concentration is not conductive (totally depleted). Generation of charge by the $\alpha$-particle is a phenomenon occurring at considerably deep portion in the substrate in comparison to thickness of the active layer 112. We have confirmed that when the p-type layer 118 of high concentration is arranged in such a deep portion, the effect of suppressing the influence of $\alpha$-particle scarcely varies. Further, according to this structure, any increase of the parasitic capacitance due to arrangement of the p-type layers 117, 118 can be made negligibly small.

Processes for achieving the structure of FIG. 11 will be described as follows. In this embodiment, a semi-insulating GaAs substrate 111 is used, and all layers of n and p types are formed on the substrate 111 by the ion implantation. First, ions to provide acceptor impurity, such as Be, Mg, Cd, C, are implanted to the semi-insulating GaAs substrate once or otherwise several times at the energy variation, whereby the p-type layers 117, 118 are formed. The ion implantation of high energy is required for the p-type layer of high concentration at the deep portion so as to decrease the capacitance, and is usually selected within range of 150 keV~3 MeV. The dose depends on the implantation energy, but is usually selected within a range of $10^{11}$ cm$^{-2}$ or more. Next, ions to provide donor impurity, such as Si, Se, S, Te, are implanted so as to form the active n-type layer 112 and the n+-type layer 116. For the n-type layer 112, the energy and the dose are selected within a range of 30~100 keV and within a range of $10^{11}$~$10^{13}$ cm$^{-2}$, respectively. For the n+ layer 116, the energy and the dose are selected within a range of 30~200 keV and within range of $10^{12}$~$10^{15}$ cm$^{-2}$, respectively. The annealing after the ion implantation is performed at a temperature of 600°~900° C. for 5~30 minutes. Usually, after all ion implantation is finished, annealing is performed once. However, the annealing of n-type may be performed and then the p-type implantation annealing may be performed. Or, after the implantation and the annealing of the p-type layer and the active n-type layer, the gate 114 may be formed and the self-alignment implantation and annealing of the n+-type layer may be performed. Of course, other various processes may be effected. Next, the ohmic electrode 113 and the gate electrode 114 are formed so as to constitute the FET.

Tenth Embodiment

Figure 11:
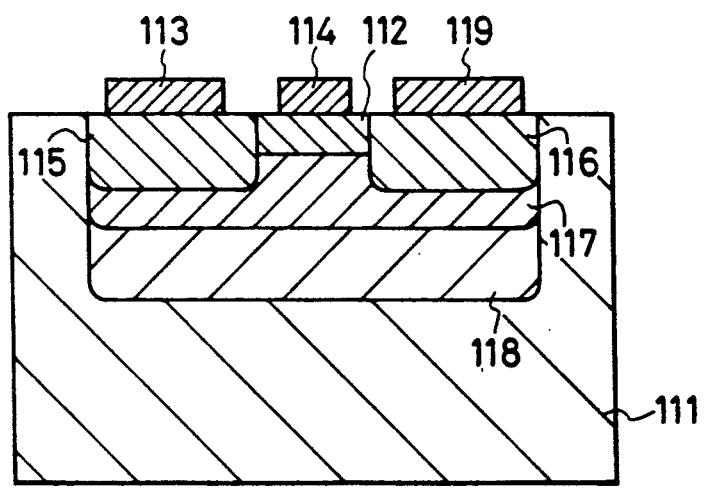
FIG. 11 is a sectional view of a field effect transistor as a ninth embodiment.
Figure 12:
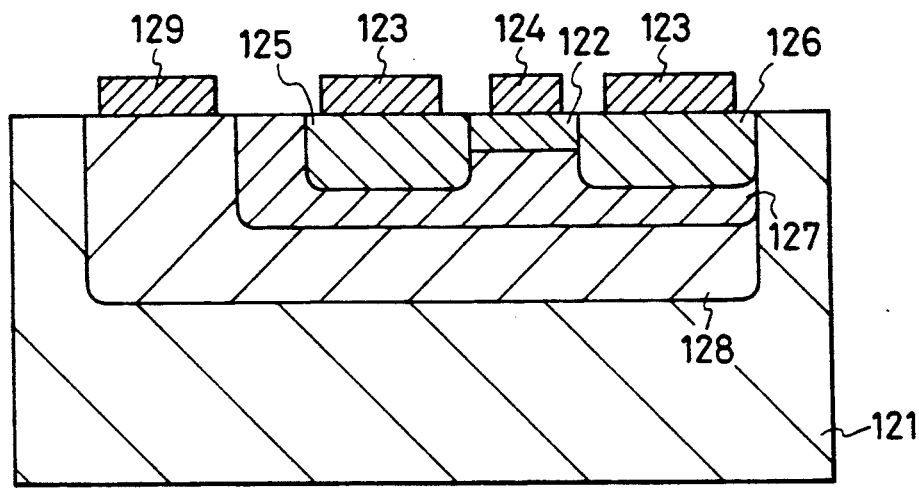
FIG. 12 is a sectional view of a field effect transistor as a tenth embodiment.

FIG. 11 shows structure where the buried p-type layer 118 is not provided with an electrode. In a tenth embodiment as shown in FIG. 12, a control electrode 129 is added to the structure of FIG. 11 and voltage of a buried p-type layer 128 can be controlled.

This embodiment is also formed by all ion implantation processes in a similar manner to the ninth embodiment. However, in order to form the p-type layer 128 of high concentration at a deep portion, the ion implantation of high energy is not used but the ion implantation utilizing the channeling to obtain a deep p-type layer is performed.

Figure 13:
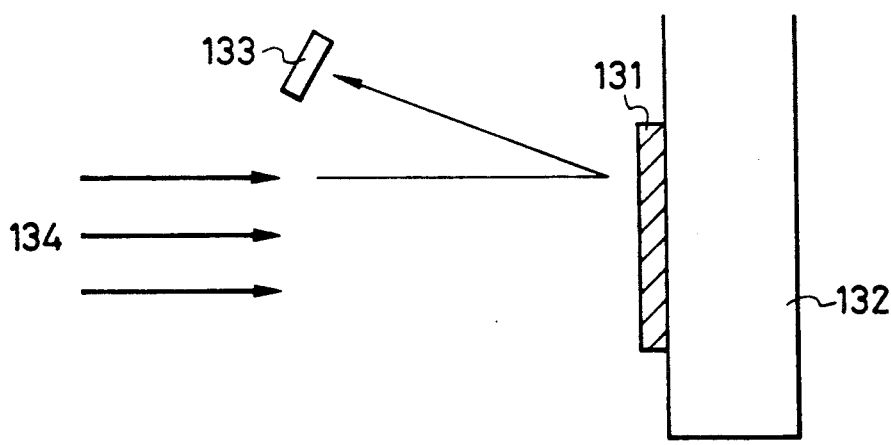
FIG. 13 is a diagram illustrating concept of a channeling implantation device.

FIG. 13 shows the concept of a channeling ion implantation device. First, a manipulator 132 is adjusted so that ion beam 134 and crystal axis (low index axis such as <100>, <110>, <111>) of GaAs substrate 131 are arranged accurately in parallel to each other. He ion beam is produced by the ion implantation device and applied to the GaAs substrate 131. Then the reflected ions are received by a detector 133, and the incident angle to the GaAs crystal 131 is adjusted using the manipulator 132 so that the reflected ions become minimum. Next, when the same device is used, the ion beam is converted into ions to provide donor (acceptor) impurity to GaAs, such as Si, Se, S, (Zn, Cd, Mg) and the ion implantation is still performed. Since the ion beam is entered in parallel to the crystal lattice of the GaAs crystal 131, the incident ions are not liable to the scattering by the crystal lattice and can be entered to the deep portion in the crystal at low energy. Other n, n+ layers and electrodes are formed by a similar process to that described in the ninth embodiment, thus the field effect transistor is completed.

Eleventh Embodiment

Figure 14:
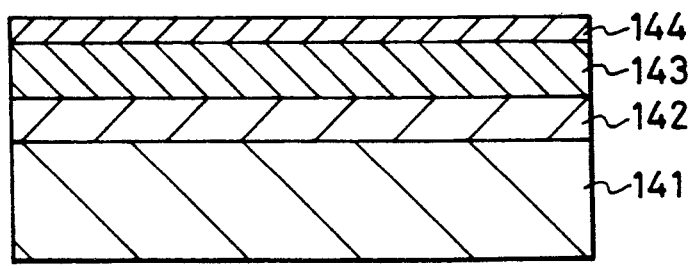
FIG. 14 is a sectional view of a field effect transistor as an eleventh embodiment.

In an eleventh embodiment, a transistor is produced using an epitaxial growth method or using an epitaxial growth method together with an ion implantation method. As shown in FIG. 14, on a semi-insulating GaAs substrate 141, epitaxial growth of p-type GaAs layer 142 of high concentration, p-type GaAs layer 143 of low concentration and an active n-type layer 144 is performed in this order. The epitaxial growth method may be any of metalorganic chemical vapor deposition (MO.CVD) method, molecular beam epitaxy (MBE) method, halogen vapor phase epitaxy (VPE) method and liquid phase epitaxy (LPE) method. The active layer (numeral 2 in FIG. 1) uses the epitaxially growth layer, and after the transistor is formed, mesa etching is performed or the ion implantation of element to make GaAs high resistance, such as $O_2$, Cr, Fe, is performed, thereby element separation is performed. Or, the epitaxial growth is performed only at the p-type layers 142, 143, and ion to provide donor impurity, such as Si, Se, S, may be selectively implanted in the p-type layer 143 of low concentration so as to form the active layer and the n+-type layers (numerals 2, 5, 6 in FIG. 1). Next, electrodes (numerals 8, 9 in FIG. 1) are formed in similar process to that described in the ninth embodiment, thus the field effect transistor is completed.

In the description of the above-mentioned embodiments, conduction type of the buried layer or the substrate is made p-type and conduction type of the active layer is made n-type. However, even when the conduction type is reversed, the amount of flowing-in of carriers by the α-particle incidence can be made less than the charge generated by the α-particles.

Although the substrate material is limited to GaAs in the description, other compound semiconductor such as InP, GaAlAs, InGaAs, InGaAsP, of course, can suppress the carrier multiplication effect by the device structure of the invention. Because mobility of electron in compound semiconductor is usually larger by one order of magnitude than mobility of hole, the holes always remain in the substrate.

Regarding the substrate of Si, Ge, the carrier multiplication is small in itself and can be suppressed similarly.

According to the invention as above described, the carrier multiplication effect caused by the α-particle incidence can be suppressed so the α-particle immunity can be increased in comparison to the prior art. Thus the short channel effect can be prevented and the soft error can be suppressed.

Twelfth Embodiment

When the FET's mentioned in detail in the foregoing embodiments are to be adapted to practical integrating circuits, it becomes necessary to compensate the variation of threshold voltage caused by temperature change and the like.

This embodiment will now deal with a circuit for compensating the variation of threshold voltage (particularly when the integrated circuit is in operation).

The circuit of this embodiment features the provision of means which detects the variation of characteristics of a semiconductor device during the operation, and means which feeds back the detected result to compensate the variation of characteristics.

When the circuit is to be adapted to the FET, in particular, provision is made of a fourth electrode in addition to the source, drain and gate electrodes mentioned in the foregoing embodiments, and a voltage applied to the fourth electrode is changed in order to control the threshold voltage. Moreover provision is made of means to control the voltage applied to the fourth electrode depending upon the change of threshold voltage of the FET.

That is, based upon such a characteristic that the threshold voltages of FET's in the same semiconductor integrated circuit chip become nearly equal to each other, a dummy FET is provided in the chip to monitor the threshold voltage, a feedback loop is constituted so that the threshold voltage of the dummy FET assumes a desired value at all times, and the voltage applied to the fourth electrode of the dummy FET is also applied to the fourth electrode of FET's that will produce predetermined circuit functions, such that the threshold voltages of all FET's to be controlled will assume a desired value.

Figure 15:
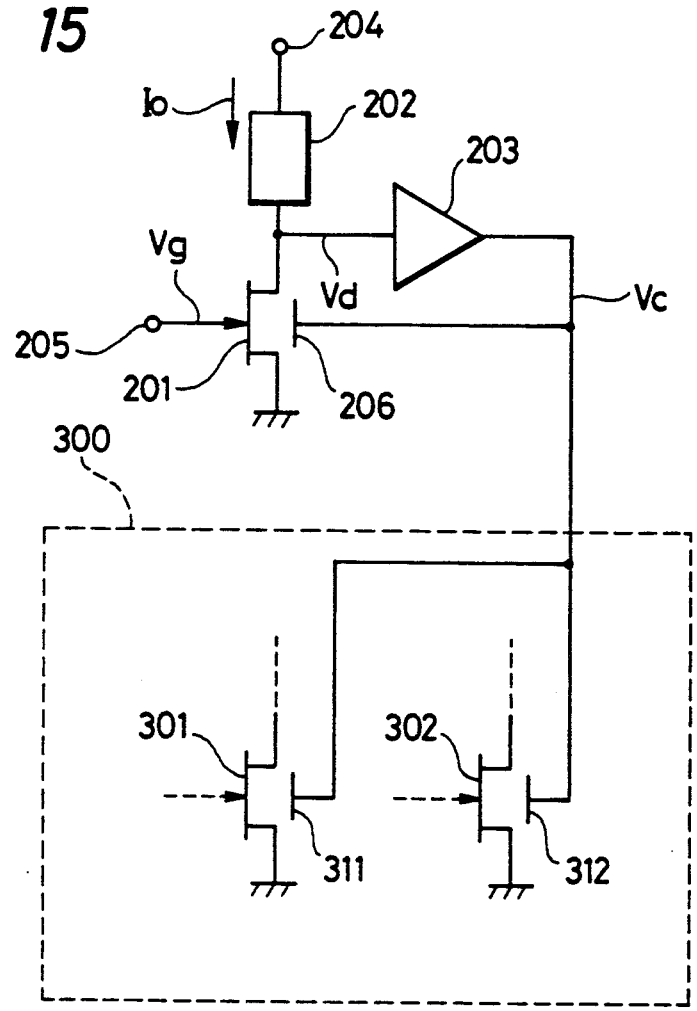
FIG. 15 is a diagram illustrating a fundamental structure of a circuit as a twelfth embodiment.

FIG. 15 shows the fundamental structure of a circuit according to this embodiment, wherein reference numeral 300 denotes a circuit network having predetermined logic functions and (or) memory functions of the integrated circuit, 301 and 302 denotes FET's (first FET's) used therein, and 201 denotes a dummy FET (second FET) for monitoring the threshold voltage of FET's in the integrated circuit. These FET's 201, 301 and 302 are at least formed on the same semiconductor chip. The FET's 201, 301 and 302 have fourth electrodes 206, 311 and 312 in addition to the source, drain and gate electrodes, to change the threshold voltage depending upon the applied voltage. Such FET's can be realized by providing under the channel region a layer having a conduction type opposite to that of the channel region to which the voltage is applied via the electrodes 206, 311 and 312. That is, when a p-type (n-type) layer is provided under the channel of an n-channel (or p-channel) FET, decrease (increase) of a voltage applied to the p-type (n-type) layer causes the channel layer to close, and the gate voltage required to cut off the channel is increased (decreased). With such a structure, therefore, the threshold voltage can be increased (decreased) by decreasing (increasing) the voltage applied to the p-type (n-type) layer.

A suitable example of the layer having the conduction type opposite to that of the channel region may be the layer that is not completely depleted as described in the first embodiment.

This will be described hereinbelow.

This circuit utilizes the principle in that the threshold voltage of the FET changes if a voltage applied to the fourth electrode is varied. Therefore, the greater the change of the threshold voltage relative to the change of voltage applied to the fourth electrode, the greater the effect exhibited by this circuit.

With an FET having a p-type layer which is not totally depleted and to which the fourth electrode is connected as described, for example, in the first embodiment, the effect of voltage change of the p-type layer reaches just under the channel, and the threshold voltage undergoes the change. Therefore, the circuit easily operates to exhibit improved effects.

The effect differs greatly from the FET having a totally depleted p-type layer. In the case of this FET, the effect is not exhibited to a practicable degree.

If the p-type layer is formed at a high impurity concentration near the channel so that it is not totally depleted, there can be realized a sensitivity which is so high that the threshold voltage changes as much as about 1 mV per a change of 1 mV of the voltage applied to the p-type layer via the fourth electrode. Reference numeral 202 of FIG. 15 denotes a load device for supplying a very small current (a current sufficiently smaller than the ability of current drive of FET 201, or about 1/100 to 1/1000 of the ability of current drive) to the FET 201. Concretely speaking, reference numeral 202 denotes a load device having a resistance sufficiently higher than the on-resistance of the FET 201. Reference numeral 203 denotes a buffer circuit for applying the feedback, 204 denotes a power source of the high potential side, and 205 denotes a terminal for supplying a voltage (strictly speaking, a voltage slightly higher than a desired threshold voltage) that corresponds to the desired threshold voltage. In the following description, a current that flows through the load device 202 is denoted by Io, a voltage applied to the terminal 205 is denoted by Vg, a voltage at a connecting point between the FET 201 and the load device 202 is denoted by Vd, a control voltage applied to the electrodes 206, 311 and 312 is denoted by Vc, and a threshold voltage of the FET 201 and a K value are denoted by Vt and K, respectively.

Next, operation of the circuit of FIG. 15 will be described. If now the threshold voltage Vt of FET 201 becomes higher than the gate voltage Vg, the FET 201 is shut off. Then, the voltage Vd increases, the output voltage Vc of the buffer circuit increases, and the feedback is so applied as to lower the threshold voltage Vt of the FET 201. Conversely, if the threshold voltage Vt becomes lower than the gate voltage Vg, the FET 201 assumes the on-state. Then, the ability of current drive of FET 201 becomes sufficiently greater than the current Io, whereby the voltages Vd and Vc decreases and the feedback is so applied as to increase the threshold voltage Vt. Therefore, at a moment when the threshold voltage Vt becomes nearly equal to the gate voltage Vg (strictly speaking, at a moment when the threshold voltage Vt is lower than Vg by an amount of a slight current Io that flows into FET 201), a stable state is assumed. Since the output voltage Vc at this moment has also been applied to the FET's 301 and 302 via electrodes 311 and 312, threshold voltages of the FET's 301 and 302 also become equal to the threshold voltage Vt of the FET 201.

Quantitatively, the stable state is assumed when, $$K(Vg - Vt)^2 = Io$$

i.e., when, $$Vt = Vg - \sqrt{Io/K}$$

Figure 16:
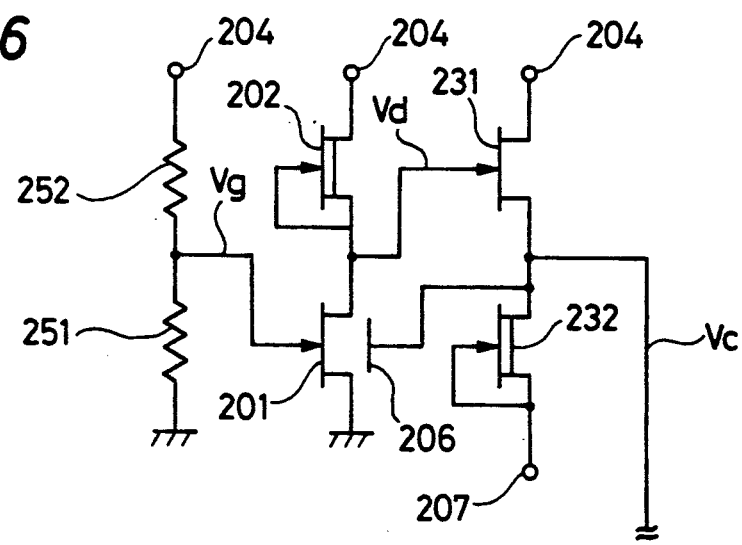
FIG. 16 is a diagram illustrating a circuit in which a buffer circuit is constituted by the source follower, and a voltage corresponding to a desired threshold voltage is generated relying upon the division by resistors.

Therefore, to suppress the difference between the threshold voltage Vt and the gate voltage Vg to be about 30 mV, $K \geq 10$ mA/V$^2$ is obtained if $Io \leq 10$ μA, and hence the gate width of the FET 201 should be set to be 10 to 100 μm or greater. In the circuit of FIG. 15, if the threshold voltage of FET changes due to temperature variation, the control voltage Vc so changes that the threshold voltage Vt of the FET 201 becomes nearly equal to the gate voltage Vg at all times owing to the aforementioned feedback operation. Further, the FET 201 and the FET's 301 and 302 are formed on the same chip and are, hence, heated nearly at the same temperature, so that the threshold voltages of the individual FET's become nearly the same. Therefore, the threshold voltages of the FET's become nearly equal to the gate voltage Vg at all times. It will be obvious that the aforementioned feedback operation also helps correct the deviation of threshold voltage of FET's caused by variation in the FET manufacturing conditions in addition to temperature variation. The embodiment will be described concretely in conjunction with FIGS. 16 and 18 to 23, which, however, do not illustrate a portion that corresponds to the circuit 300 of FIG. 15. FIG. 16 is a circuit diagram in which a buffer circuit is constituted by the source follower, and a voltage corresponding to a desired threshold voltage is generated being divided by resistors. Reference numeral 231 denotes a FET for the source follower, 232 denotes a load FET for supplying a current to the source follower, and a buffer circuit is constituted by these two FET's. Reference numerals 251 and 252 denote resistors for dividing the voltage. There may exist a great difference between the designed value and the realized value of the resistors formed on an integrated circuit. The two resistors, however, exhibit a small variance in the resistance ratio, and, therefore it can be considered that variation of the gate voltage is solely determined by the variation of supply voltage. Namely, the gate voltage assumes a value obtained by multiplying the voltage of the power source 204 by a ratio of the resistance 251 to the sum of the resistances 251 and 252. Since the former one remains nearly constant, variation of the latter one only determines the variation of the gate voltage Vg. Therefore, if the device is so designed that the gate voltage has a small absolute value, variation of the gate voltage Vg can be suppressed.

Figure 17:
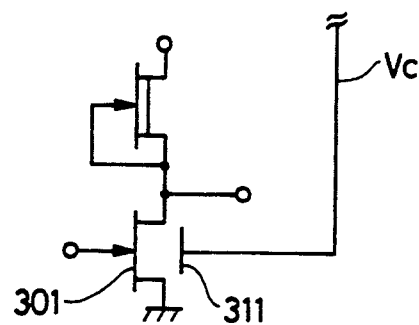
FIG. 17 is a diagram illustrating a DCFL circuit.

On the other hand, when a DCFL circuit (direct coupled FET logic circuit having a logic function made up of one or more FET's and a load device connected in series thereto, which can be connected in a plurality of stages without using a level shift circuit, and in which the input terminal serving as a gate electrode for the FET's and the output terminal being a connection point between the logic function and the load device) shown in FIG. 17 is employed for the circuit (circuit 300 of FIG. 15) of the main body that has predetermined logic functions and memory functions, it is most desirable if the threshold voltage of the drive FET 301 assumes a positive value (about 0 V to 0.1 V) which is close to 0 V. When the threshold voltage of the drive FET 301 is higher than a voltage range of 0 V to 0.1 V, the electric current which flows into the drive FET 301 decreases and the circuit operates slowly. When the threshold voltage of the drive FET 301 is lower than the voltage range of 0 V to 0.1 V, the drive FET 301 is cut off and the operation margin decreases. When the DCFL circuit is employed for the circuit of the main body, therefore, the circuit of FIG. 16 should be so designed that the gate voltage Vg approaches 0 V, so that the threshold voltage of the FET assumes the most desirable value without being affected by variance in the resistance or in the power supply voltage. FIG. 16 employs a FET of which the gate electrode is connected to the source electrode as the load element 202 for supplying a slight current to the FET 201. Here, if the gate of the load FET 202 is formed to be sufficiently narrower than the gate of the FET 201, and/or if the gate of the load FET 202 is formed to be sufficiently longer than the gate of the FET 201, the aforementioned requirement (to supply a current sufficiently smaller than the ability of current drive of FET 201) is satisfied.

Figure 18:
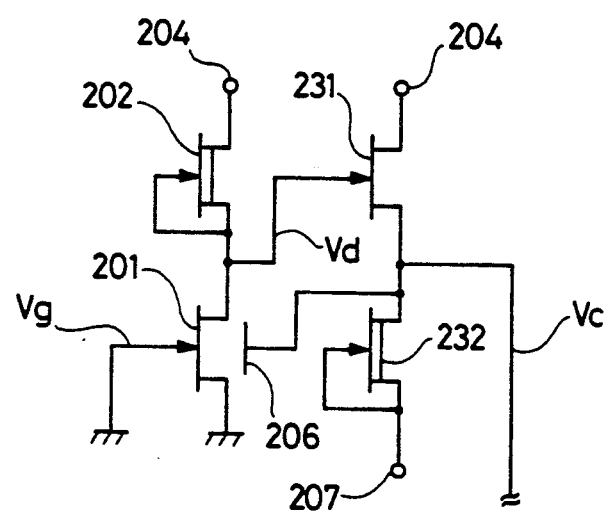
FIG. 18 is a diagram which illustrates the circuit of FIG. 16 in a simplified form, and in which the gate electrode and the source electrode of an FET 201 are connected so that $V_g = 0$.

FIG. 18 is a diagram which illustrates the circuit of FIG. 16 in a simplified form, and wherein the gate electrode and the source electrode of the FET 201 are connected together so that the gate voltage Vg becomes 0 V. As illustrated in detail with reference to FIG. 15, the threshold voltage of the FET that is to be controlled is slightly smaller than the gate voltage Vg. The gate voltage Vg can be set to be 0 V as shown in FIG. 18 when there virtually arises no problem even when the threshold voltages of FET's 301, 302 in the circuit network 300 assume negative values to some extent. Or, in the circuit of FIG. 18, if the ground potential (potential which connects the gate electrode and source electrode of FET 201) of the control circuit is selected to be slightly lower than the ground potential (potential which connects the source electrodes of FET's 301 and 302) of the circuit 300 shown in FIG. 15, the voltage applied across the source electrode and the fourth electrodes 311, 312 of FET's 301, 302 of the circuit of the main body becomes slightly smaller than the voltage that is applied across the source electrode and the fourth electrode 206 of the monitoring FET 201. Therefore, the threshold voltages of FET's 301 and 302 of the circuit of the main body will become slightly greater than the threshold voltage Vt of the monitoring FET 201. Thus, use of the circuit of FIG. 18 enables the threshold voltages of FET's 301 and 302 of the circuit of the main body to assume positive values.

Figure 19:
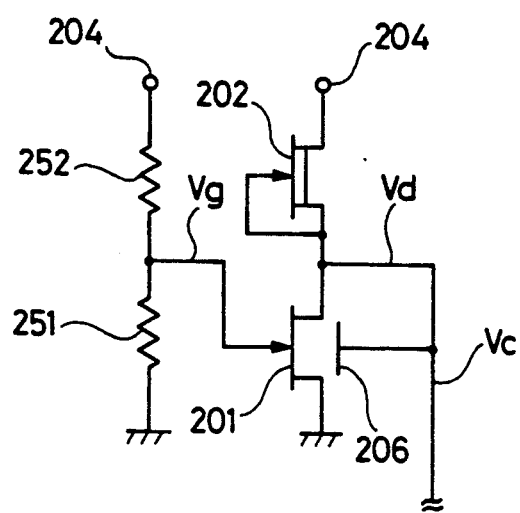
FIG. 19 is a diagram which illustrates the circuit of FIG. 16 in a simplified form, and in which the drain voltage of the FET 201 is directly supplied to a fourth electrode 206 without passing through the buffer circuit.

FIG. 19 is a diagram which illustrates the circuit of FIG. 16 in a simplified form, and in which the drain voltage of FET 201 is directly supplied to the fourth electrode 206 without passing through the buffer circuit. The circuit of FIG. 19 can be employed when the scale of the circuit network 300 (FIG. 15) of the main body is relatively small and when large noise is not superposed on the control voltage Vc.

Figure 20:
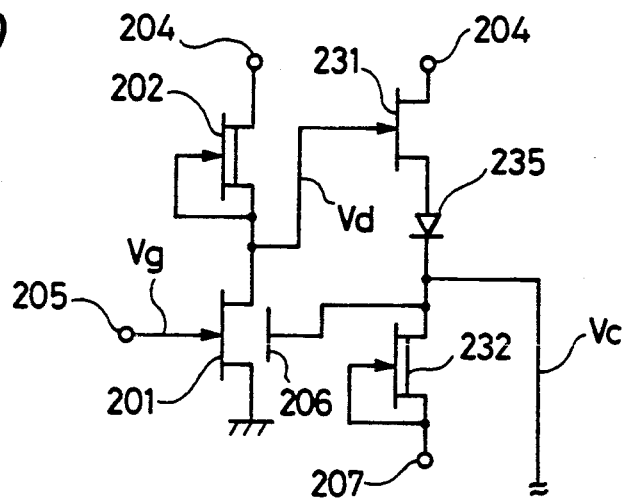
FIG. 20 is a circuit diagram in which a level shift diode is inserted in the circuit of FIG. 18.
Figure 21:
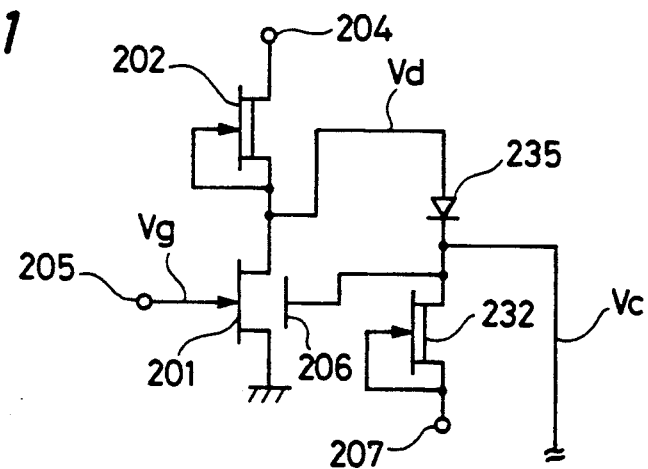
FIG. 21 is a circuit diagram in which the level shift diode is inserted in the circuit of FIG. 19.

Further, when the control voltage Vc, which is necessary to bring the threshold voltages of FET's 201, 301 and 302 to desired values, assumes a negative value and cannot be controlled by the circuit of FIGS. 16, 18 or 19, a level shift diode 235 should be inserted as shown in FIGS. 20 and 21 to control the voltage Vc. The diagrams subsequent to FIGS. 20 and 21 do not illustrate the circuit which supplies the gate voltage Vg. Depending upon the level of control voltage Vc, the level shift diodes 235 may be connected in a plurality of numbers in series. In the circuit of FIG. 21, furthermore, the electric current which flows into a load device 232 is set to be smaller than the electric current that flows into a load device 202, as a matter of course.

Figure 22:
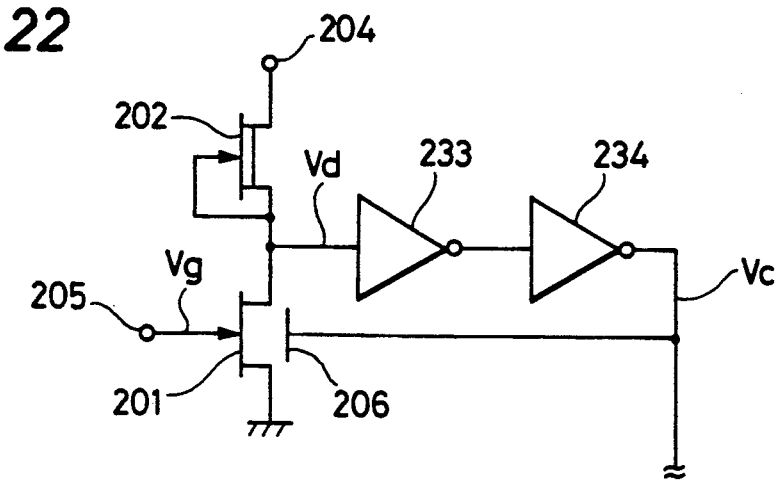
FIG. 22 is a schematic diagram of a circuit in which the buffer circuit of FIG. 15 is replaced by the inverter circuit.

If the p-type layer is formed at a shallow position under the channels of FET's 301 and 302, the parasitic capacitance increases and the operating speed decreases. In practice, therefore, the p-type layer should be formed at a position which is deep to some extent. In this case, if the threshold voltages of FET's 201, 301 and 302 change little in response to the change of the control voltage Vc, and are not controlled sufficiently by the circuit of FIGS. 16, 18 or 19, it is recommended to constitute the buffer circuit 203 of FIG. 15 using two inverter circuits 233 and 234 as shown in FIG. 22 in order to compensate the lack of sensitivity. In the circuit of FIGS. 16, 18 or 19, the change of voltage Vd turns into an amplitude or is attenuated to some extent so as to be turned into the control voltage Vc. In the circuit of FIG. 22, on the other hand, the voltage Vd can be amplified by the voltage amplification function of the inverter. Therefore, even a slight change of the voltage Vd turns into a great change of the control voltage Vc to compensate the lack of threshold voltage of the FET in response to the control voltage Vc. In the circuit of FIG. 22, furthermore, provision can be made of a level shift circuit (denoted by 232 and 235), as required, as shown in FIGS. 20 and 21.

Figure 23:
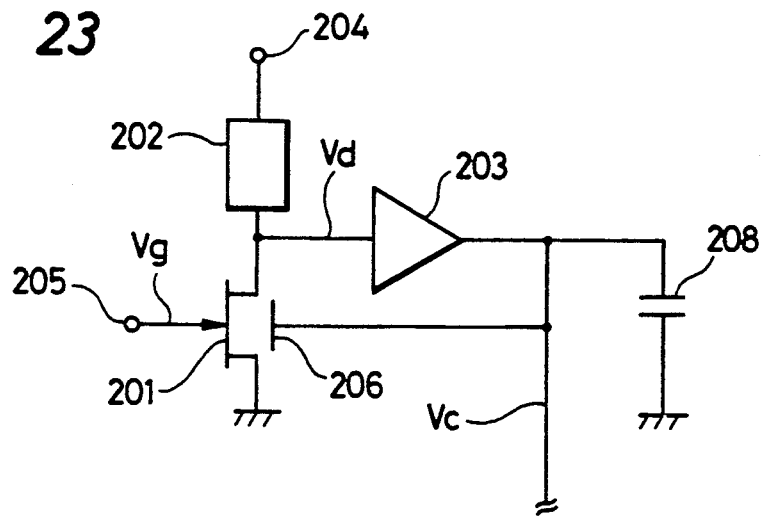
FIG. 23 is a schematic diagram of a circuit in which the circuit of FIG. 15 is equipped with a capacitor 208 for preventing the oscillation.

In FIGS. 16 and 18 to 22, the load device 202 for supplying a slight current is constituted by a FET of which the source electrode and the gate electrode are connected together. The FET, however, can be replaced by any other resistive element provided it has a high resistance. The same also holds true for the load device 232 (which needs not necessarily have a large resistance). In addition to the method of dividing the voltage by resistors, furthermore, any method may be employed to supply the gate voltage Vg provided it is capable of producing a desired voltage. The threshold voltage can also be controlled to assume a negative value by setting the gate voltage Vg to a negative value. Further, as the number of stages increases in the circuit which constitutes a feedback loop, the probability of voltage oscillation on the loop increases. In such a case, a capacitor 208 for preventing the oscillation may be provided as shown in FIG. 23 to cope with the situation.

Figure 24:
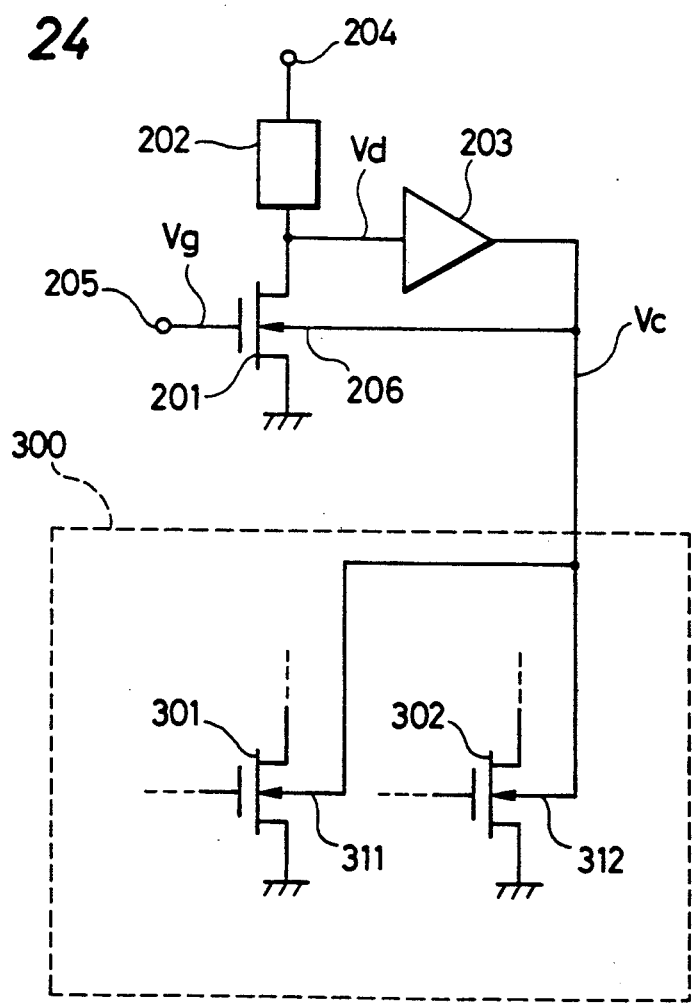
FIG. 24 is a schematic diagram of a circuit in which the circuit of FIG. 15 is adapted to MOSFET's on a silicon substrate.

The aforementioned circuit can be adapted not only to the MESFET's on the GaAs substrate but also to any FET which is equipped with the fourth electrode and of which the threshold voltage changes depending upon the applied voltage. FIG. 24 shows an example in which the invention is adapted to MOSFET's on a silicon substrate. Threshold voltages of MOSFET's on the silicon substrate decrease if the voltage of the substrate or the well is increased. Therefore, the same effects as those of the circuit of FIG. 15 can be expected even with the circuit of FIG. 24. The foregoing description has dealt with the FET of the type of which the threshold voltage decreases if an increased voltage is applied to the fourth electrode. However, the present invention can further be adapted to a FET of the type of which the threshold voltage increases when an increased voltage is applied to the fourth electrode contrary to the above-mentioned FET. In this case, the buffer circuit 203 of FIG. 15 must be equipped with an inverting function. Concretely speaking, one method consists of employing the inverters in stages of an odd number in the circuit of FIG. 22. The foregoing description has chiefly dealt with the FET's of the n-channel type. However, it needs not be pointed out that the circuit of the invention can also be adapted to the FET's of the p-channel type by changing the polarities of the power source and the level shift diodes.

Figure 25:
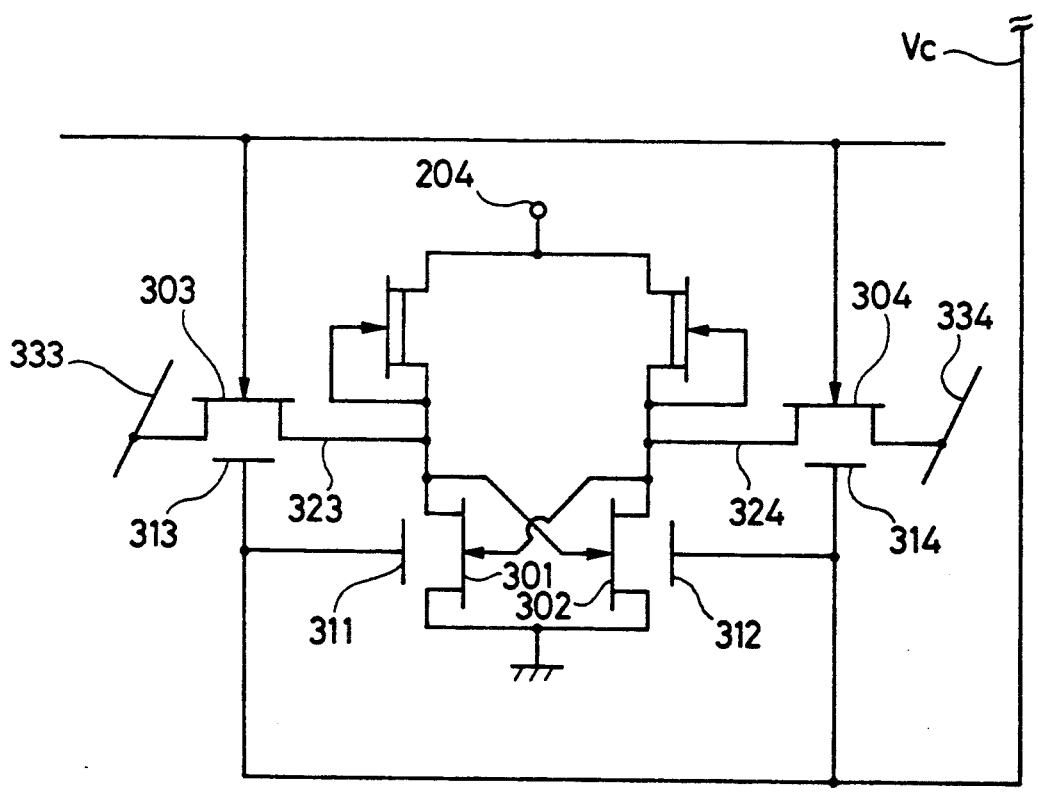
FIG. 25 is a circuit diagram illustrating a memory cell of a semiconductor memory device.

To efficiently draw the effects of this embodiment, furthermore, the source electrodes of the FET's 301, 302 used for the circuit 300 and the source electrode of the monitoring FET 201 should be served with nearly the same potential. The potential, however, needs not be the same at all times. For example, when a circuit shown in FIG. 25 is provided in the circuit 300, the FET's 301, 302, 303 and 304 have to be controlled. Here, the source electrodes of FET's 301 and 302 have been connected to ground potential like the source electrode of FET 201, but the source electrodes of FET's 303 and 304 have not been directly connected to ground potential. This circuit is used as a memory cell of the semiconductor memory. During the reading operation, the electrodes of FET's 303 and 304 of the sides 323 and 324 work as source electrodes. During the writing operation, the electrodes of the sides 333 and 334 work as source electrodes. In the case of this circuit, variance in the threshold voltages of the FET's 303 and 304 becomes a problem particularly when the potentials of the electrodes 323, 324, 333 and 334 assume low levels (close to 0 V). There is no need of precisely controlling the threshold voltage of the FET 303 or 304 when both the electrodes 323 and 333 assume the high level or when both the electrodes 324 and 334 assume the high level. Even in this circuit, therefore, the source electrodes of the FET's that are to be controlled all assume a voltage close to 0 V when the control operation is required. Accordingly, the effects of the circuit are not impaired even when it is adapted to the above-mentioned FET's that are to be controlled.

According to this embodiment as described above, a change in the characteristics of the semiconductor device is detected during the operation, and the detected result is fed back to correct the change of the characteristics, in order to compensate the change of characteristics during the operation. When the circuit of the invention is adapted to the FET's, in particular, the threshold voltages of the FET's can be controlled to assume desired values even when the characteristics of the device are changed due to temperature variation or the like.

What is claimed is:

1. A field effect transistor comprising:
a compound semiconductor substrate;
a first semiconductor layer formed in a surface region of said compound semiconductor substrate and including a source region and a drain region having a first conductivity type, and an active region having a first conductivity type formed between said source region and said drain region;
a gate electrode formed on said active region;
a source electrode formed on said source region;
a drain electrode formed on said drain region;
a second semiconductor layer of a second conductivity type opposite to said first conductivity type formed in said compound semiconductor substrate between said first semiconductor layer and said compound semiconductor substrate, and continuously formed to be in contact with a lower side of said source region, said active region and said drain region such that a depletion layer is formed on both sides of a PN junction defined by said first semiconductor layer and said second semiconductor layer, wherein said second semiconductor layer has a carrier concentration of $1 \times 10^{15}$ cm$^{-3}$ or greater at a side thereof adjacent to said compound semiconductor substrate; and
a control electrode electrically connected to only said second semiconductor layer of said field effect transistor;
wherein said field effect transistor is one of a plurality of field effect transistors integrated into an integrated circuit, and wherein said second semiconductor layer of said field effect transistor is not connected to a second semiconductor layer of any one of the other field effect transistors of said plurality of field effect transistors.

2. A field effect transistor according to claim 1, wherein said carrier concentration of said second semiconductor layer is $1 \times 10^{16}$ cm$^{-3}$ or greater.

3. A field effect transistor according to claim 1, wherein a third semiconductor layer of a second conductivity type with a predetermined low resistance is interposed between said second semiconductor layer and said control electrode.

4. A field effect transistor comprising:
a compound semiconductor substrate;
a first semiconductor layer formed in a surface region of said compound semiconductor substrate and including a source region and a drain region having a first conductivity type, and an active region having a first conductivity type formed between said source region and said drain region;
a gate electrode formed on said active region;
a source electrode formed on said source region;
a drain electrode formed on said drain region;

a second semiconductor layer of a second conductivity type opposite to said first conductivity type formed between said first semiconductor layer and said compound semiconductor substrate, and at least under one of said source region, said drain region and said active region, such that a depletion layer is formed on both sides of a PN junction defined by said first semiconductor layer and said second semiconductor layer, wherein said second semiconductor layer is comprised of a third semiconductor layer and a fourth semiconductor layer, wherein said third semiconductor layer is in contact with said first semiconductor layer, wherein the carrier concentration of said fourth semiconductor layer is $1 \times 10^{15}$ cm$^{-3}$ or greater, wherein the carrier concentration of said third semiconductor layer is lower than that of said fourth semiconductor layer, and wherein said third semiconductor layer is entirely formed between said fourth semiconductor layer and said first semiconductor layer.

5. A field effect transistor according to claim 1, wherein said compound semiconductor substrate is a semi-insulating GaAs substrate.

6. A field effect transistor according to claim 1, wherein at least one kind of dopant selected from the group consisting of Be, Mg, C and Zn is doped into said second semiconductor layer.

7. A field effect transistor according to claim 1, wherein the thickness of said second semiconductor layer is 1000 Å or more.

8. A field effect transistor comprising:
a first semiconductor layer formed in a surface region of a compound semiconductor substrate and including a source region and a drain region having a first conductivity type, and an active region having a first conductivity type formed between said source region and said drain region;
a gate electrode formed on said active region;
a source electrode formed on said source region;
a drain electrode formed on said drain region;
a second semiconductor layer of a second conductivity type opposite to said first conductivity type formed so as to only be in contact with a lower side of said active region and to be deeper than said source region and said drain region such that a depletion layer is formed on both sides of a PN junction defined by said first semiconductor layer and said second semiconductor layer, wherein said second semiconductor layer has a carrier concentration of $1 \times 10^{15}$ cm$^{-3}$ or greater at a side thereof adjacent to said compound semiconductor substrate; and
a control electrode electrically connected to said second semiconductor layer.

9. A field effect transistor comprising:
a compound semiconductor substrate;
a first semiconductor layer formed in a surface region of said compound semiconductor substrate and including a source region and a drain region having a first conductivity type, and an active region having a first conductivity type formed between said source region and said drain region;
a gate electrode formed on said active region;
a source electrode formed on said source region;
a drain electrode formed on said drain region;
a second semiconductor layer of a second conductivity type opposite to said first conductivity type formed between said first semiconductor layer and said compound semiconductor substrate, and at least under one of said source region, said drain region and said active region such that a depletion layer is formed on both sides of a PN junction defined by said first semiconductor layer and said second semiconductor layer, wherein said second semiconductor layer has a carrier concentration of $1 \times 10^{15}$ cm$^{-3}$ or greater at a side thereof adjacent to said compound semiconductor substrate; and
a control electrode electrically connected to said second semiconductor layer,
wherein said field effect transistor is connected to a detecting means for detecting a change of a threshold voltage of said field effect transistor and a correcting means which feeds back an output of said detecting means to said field effect transistor to correct the change of said threshold voltage.

10. A field effect transistor according to claim 9, wherein said field effect transistor is one of a plurality of field effect transistor integrated in an integrated circuit, said detecting means includes means for applying a voltage nearly equal to a predetermined threshold voltage to the gate electrode of said field effect transistor and means for supplying a predetermined small current to said drain region of said field effect transistor, and further wherein said correcting means feeds back a voltage of said drain region of said field effect transistor, and applies said voltage to said second semiconductor layer of said field effect transistor and to the second semiconductor layer of another field effect transistor of said plurality of field effect transistors which has the same structure as said field effect transistor.

11. A field effect transistor comprising:
a compound semiconductor substrate;
a first semiconductor layer formed in a surface region of said compound semiconductor substrate and including a source region and a drain region having a first conductivity type, and an active region having a first conductivity type formed between said source region and said drain region;
a gate electrode formed on said active region;
a source electrode formed on said source region;
a drain electrode formed on said drain region;
a second semiconductor layer of a second conductivity type opposite to said first conductivity type formed between said first semiconductor layer and said compound semiconductor substrate, and at least under one of said source region, said drain region and said active region such that a depletion layer is formed on both sides of a PN junction defined by said first semiconductor layer and said second semiconductor layer, wherein said second semiconductor layer has a carrier concentration of $1 \times 10^{15}$ cm$^{-3}$ or greater at a side thereof adjacent to said compound semiconductor substrate; and
a control electrode electrically connected to said second semiconductor layer,
wherein only one region selected from a group consisting of said source region and said drain region is electrically connected to said second semiconductor layer by said control electrode.

12. A field effect transistor comprising:
a compound semiconductor substrate;
a first semiconductor layer formed in a surface region of said compound semiconductor substrate and including a source region and a drain region having a first conductivity type, and an active region having a first conductivity type formed between said source region and said drain region;

a gate electrode formed on said active region;

a source electrode formed on said source region;

a drain electrode formed on said drain region;

a second semiconductor layer of a second conductivity type opposite to said first conductivity type formed between said first semiconductor layer and said compound semiconductor substrate, and at least under one of said source region, said drain region and said active region such that a depletion layer is formed on both sides of a PN junction defined by said first semiconductor layer and said second semiconductor layer, wherein said second semiconductor layer has a carrier concentration of $1 \times 10^{15}$ cm$^{-3}$ or greater at a side thereof adjacent to said compound semiconductor substrate; and a control electrode electrically connected to said second semiconductor layer, wherein said gate electrode and said second semiconductor layer are electrically connected.

13. A field effect transistor comprising:

a compound semiconductor substrate;

a first semiconductor layer formed in a surface region of said compound semiconductor substrate and including a source region and a drain region having a first conductivity type, and an active region having a first conductivity type formed between said source region and said drain region;

a gate electrode formed on said active region;

a source electrode formed on said source region;

a drain electrode formed on said drain region;

a second semiconductor layer of a second conductivity type opposite to said first conductivity type formed between said first semiconductor layer and said compound semiconductor substrate, and at least under one of said source region, said drain region and said active region such that a depletion layer is formed on both sides of a PN junction defined by said first semiconductor layer and said second semiconductor layer, wherein said second semiconductor layer has a carrier concentration of $1 \times 10^{15}$ cm$^{-3}$ or greater at a side thereof adjacent to said compound semiconductor substrate; and a control electrode electrically connected to said second semiconductor layer, wherein a length of said second semiconductor layer is shorter than that of said gate electrode.

14. A field effect transistor according to claim 10, wherein said field effect transistor, said detecting means and said correcting means are integrated in said substrate.

15. A field effect transistor according to claim 9, wherein said correcting means feeds back the output of said detecting means to said control electrode to provide a correcting voltage at said control electrode to control the threshold voltage of said field effect transistor through said second semiconductor layer.

16. A field effect transistor according to claim 10, wherein said correcting means feeds back the output of said detecting means to control electrodes of said field effect transistor, said one field effect transistor and said another field effect transistor to control threshold voltages of said field effect transistor, said one field effect transistor and said another field effect transistor through said second semiconductor layers thereof.

17. A field effect transistor according to claim 10, wherein said means for applying a voltage nearly equal to said predetermined threshold voltage comprises a voltage divider coupled between a voltage source and the gate of said field effect transistor.

18. A field effect transistor according to claim 10, wherein said correcting means includes a buffer circuit coupled between the drain of said field effect transistor and control electrodes of said field effect transistor, said one field effect transistor and said another field effect transistor.

19. A field effect transistor according to claim 17, wherein said correcting means includes a buffer circuit coupled between the drain of said field effect transistor and control electrodes of said field effect transistor, said one field effect transistor and said another field effect transistor.

20. A field effect transistor according to claim 19, wherein said buffer circuit comprises a source follower circuit.

21. A field effect transistor according to claim 19, wherein said buffer circuit includes a level shift element.

22. A field effect transistor according to claim 20, wherein said buffer circuit includes a level shift element.

23. A field effect transistor according to claim 19, further comprising a capacitor coupled to said buffer circuit for suppressing oscillation.

24. A field effect transistor according to claim 4, further comprising a control electrode connected to the fourth semiconductor layer of said second semiconductor layer.

25. A field effect transistor comprising:

a first semiconductor layer formed in a surface region of a compound semiconductor substrate and including a source region and a drain region having a first conductivity type, and an active region having a first conductivity type formed between said source region and said drain region;

a gate electrode formed on said active region;

a source electrode formed on said source region;

a drain electrode formed on said drain region; and a second semiconductor layer of a second conductivity type continuously formed in contact with a lower side of said source region, said active region and said drain region so as to expose a part of said lower side of said drain region, and further comprising a control electrode electrically connected to said second semiconductor layer.

26. A field effect transistor according to claim 4, further comprising a control electrode electrically connected to said second semiconductor layer.

27. A field effect transistor according to claim 13, wherein the bottom of said second semiconductor layer is deeper than bottoms of said source region and said drain region.

28. A field effect transistor according to claim 1, wherein said control electrode and said second semiconductor layer are connected through a highly doped layer formed in said second semiconductor layer, wherein said highly doped layer has said second conductivity type and a high impurity concentration than that of said second semiconductor layer, and wherein said source, drain and control electrodes are made of the same material.

29. A field effect transistor according to claim 11, wherein said control electrode and said second semiconductor layer are connected through a highly doped layer formed in said second semiconductor layer, wherein said highly doped layer has said second conductivity type and a higher impurity concentration than that of said second semiconductor layer, and wherein said source, drain and control electrodes are made of the same material.

30. A field effect transistor according to claim 12, wherein said control electrode and said second semiconductor layer are connected through a highly doped layer formed in said second semiconductor layer, wherein said highly doped layer has said second conductivity type and a higher impurity concentration than that of said second semiconductor layer, and wherein said source, drain and control electrodes are made of the same material.

31. A field effect transistor according to claim 25, wherein said control electrode and said second semiconductor layer are connected through a highly doped layer formed in said second semiconductor layer, wherein said highly doped layer has said second conductivity type and a higher impurity concentration than that of said second semiconductor layer, and wherein said source, drain and control electrodes are made of the same material.

32. A field effect transistor according to claim 26, wherein said control electrode and said second semiconductor layer are connected through a highly doped layer formed in said second semiconductor layer, wherein said highly doped layer has said second conductivity type and a higher impurity concentration than that of said second semiconductor layer, and wherein said source, drain and control electrodes are made of the same material.

33. A field effect transistor according to claim 13, wherein said control electrode and said second semiconductor layer are connected through a highly doped layer formed in said second semiconductor layer, wherein said highly doped layer has said second conductivity type and a higher impurity concentration than that of said second semiconductor layer, and wherein said source, drain and control electrodes are made of the same material.

34. A field effect transistor according to claim 8, wherein said control electrode and said second semiconductor layer are connected through a highly doped layer formed in said second semiconductor layer, wherein said highly doped layer has said second conductivity type and a higher impurity concentration when that of said second semiconductor layer, and wherein said source, drain and control electrodes are made of the same material.

35. A field effect transistor comprising:
   a compound semiconductor substrate;
   a first semiconductor layer formed in a surface region of said compound semiconductor substrate and including a source region and a drain region having a first conductivity type, and an active region having a first conductivity type formed between said source region and said drain region;
   a gate electrode formed on said active region;
   a source electrode formed on said source region;
   a drain electrode formed on said drain region;
   a second semiconductor layer of a second conductivity type opposite to said first conductivity type formed in said compound semiconductor substrate between said first semiconductor layer and said compound semiconductor substrate, and continuously formed to be in contact with a lower side of said source region, said active region and said drain region such that a depletion layer is formed on both sides of a PN junction defined by said first semiconductor layer and said second semiconductor layer, wherein said second semiconductor layer has a carrier concentration of $1 \times 10^{15}$ cm$^{-3}$ or greater at a side thereof adjacent to said compound semiconductor substrate; and
   a control electrode electrically connected to only said second semiconductor layer of said field effect transistor;
   wherein the thickness of said second semiconductor layer is 1000 Å or more.

36. A field effect transistor according to claim 1, wherein only predetermined ones of said plurality of field effect transistors include said second semiconductor layer.

* * * * *